(12) United States Patent
Jasa et al.

(10) Patent No.: US 7,068,113 B2
(45) Date of Patent: Jun. 27, 2006

(54) BURST MODE CLOCK AND DATA RECOVERY FREQUENCY CALIBRATION

(75) Inventors: Hrvoje Jasa, Scarborough, ME (US);
Gary D. Polhemus, Sebago, ME (US);
Kenneth Patrick Snowdon, Falmouth, ME (US)

(73) Assignee: Agere Systems Inc., Allentown, PA (US)

( * ) Notice: Subject to any disclaimer, the term of this patent is extended or adjusted under 35 U.S.C. 154(b) by 40 days.

(21) Appl. No.: 10/814,250

(22) Filed: Apr. 1, 2004

(65) Prior Publication Data
US 2005/0218999 A1 Oct. 6, 2005

(51) Int. Cl.
*G01R 23/00* (2006.01)
(52) U.S. Cl. .......................................... 331/44; 331/49
(58) Field of Classification Search ................ None
See application file for complete search history.

(56) References Cited

U.S. PATENT DOCUMENTS 6,040,743 A * 3/2000 Bjorklid et al. ............ 331/57
6,707,342 B1 * 3/2004 Zachan et al. ................ 331/2
6,788,155 B1 * 9/2004 Chaudhuri et al. .......... 331/46
6,803,827 B1 * 10/2004 Kenney et al. ............. 331/16
6,833,767 B1 * 12/2004 Huff et al. .................. 331/17

* cited by examiner

*Primary Examiner*—Timothy P. Callahan
*Assistant Examiner*—Cassandra Cox

(57) ABSTRACT

A direct calibration technique significantly tightens a tolerance band between multiple voltage controlled oscillators (VCOs), to correct for slight frequency mismatch between the multiple VCOs. The tightened tolerance band enhances the bit error rate (BER) and/or lengthens the possible consecutive identical digits (CIDs) length, and is particularly useful in integrated circuit applications. A Frequency Locked Loop (FLL), an accumulator, and a DAC are implemented to form a calibration loop that becomes far more digital in nature than a PLL, permitting greater embedded circuit test coverage and ease of integration in VLSI digital technologies. A frequency calibrated loop with digital accumulator and DAC in lieu of a PLL with associated charge pump integrator eliminates the need for large integrated capacitors, sensitivity to drift due to the leakage currents associated with deep sub-micron technologies, and embedded analog voltages which generally cannot be tested.

19 Claims, 3 Drawing Sheets

//BURST MODE CLOCK AND DATA RECOVERY FREQUENCY CALIBRATION

BACKGROUND OF THE INVENTION

1. Field of the Invention

This invention relates generally to data recovery. More particularly, it relates to a calibration technique for minimizing mismatch between oscillators in a burst mode data recovery circuit.

2. Background of Related Art

In creating a burst mode data recovery circuit, it is desirable to use multiple voltage controlled oscillators (VCOs) to reduce phase and frequency deviations in the recovered time base signal. These VCOs must (1) oscillate at a specific frequency within a tolerance band; and (2) must match output frequency with each other to within this tolerance band. The degree of error allowed within this tolerance band limits the length that the received information packet may be detected without introducing bit errors.

A basic technique for burst mode data recovery was pioneered by Alfred Dunlop, et al. at what is now LUCENT TECHNOLOGIES in 1992, as disclosed in U.S. Pat. No. 5,237,290, as exemplified herein in FIG. 2.

As shown in FIG. 2, Dunlop discloses a clock recovery circuit 10 that uses indirect tuning of variable frequency voltage controlled oscillators (VCOs) 11, 12. To indirectly tune the VCOs 11, 12, Dunlop uses a phase locked loop (PLL) clock recovery circuit 20 that relies on closely replicated physical and electrical characteristics of the multiple oscillators 11, 12, 18. However, since Dunlop's circuits are only indirectly tuned, the circuit's oscillators 11, 12, 18 will inherently run at somewhat different frequencies, based on a tolerance. That frequency difference between oscillators will be emphasized, causing frequency drift and possible loss of alignment between the recovered clock signal and incoming data when the input signal is not transitioning, as it is during unbroken strings of ones and zeros or consecutive identical digits (CIDs). When transitions are absent from the input signal for a prolonged period and the recovered clock drifts, the recovered clock will be out of phase when the transitions reappear, thereby causing errors until the oscillators can be resynchronized.

Thus, the indirect tuning taught by Dunlop's burst mode optical receiver is seen by the present inventors as suffering from VCO mismatch. While Dunlop's circuit requires manual component selection to provide as best a good frequency match within a given tolerance, Dunlop teaches accommodation of a significant tolerance nonetheless. Dunlop fails to recognize a need for, attempt or disclose direct calibration or tuning of the VCOs 11, 12.

Frequency calibration was attempted by W. Pitio, et al. in this regard in 1992, as disclosed in U.S. Pat. No. 5,843,980, and as shown herein in FIG. 3.

In particular, as shown in FIG. 3, Pitio teaches the use of a number of VCOs 31, 32 that are calibrated using a Phase Locked Loop (PLL) and sample-hold 41, 42 to set the frequency of the respective VCOs 31, 32 during a calibration routine, and to hold the calibrated VCO control parameters while the VCOs 31, 32 are in use. While Pitio provides a valid approach, the present inventors deem such an approach limiting to today's IC integration demands. For instance, phase locked loops (PLLs) are generally analog circuits and can be difficult to integrate with VLSI digital circuits. The need to minimize the use of large passive components, found in analog PLL loop filters, is of particular concern.

There is a need for a technique for matching or calibrating multiple VCOs in such tight tolerance with one another so as to allow lower bit error rates (BER) and/or to allow data packets containing longer CIDs to pass.

BRIEF DESCRIPTION OF THE DRAWINGS

Features and advantages of the present invention will become apparent to those skilled in the art from the following description with reference to the drawings, in which.

SUMMARY OF THE INVENTION

Figure 1:
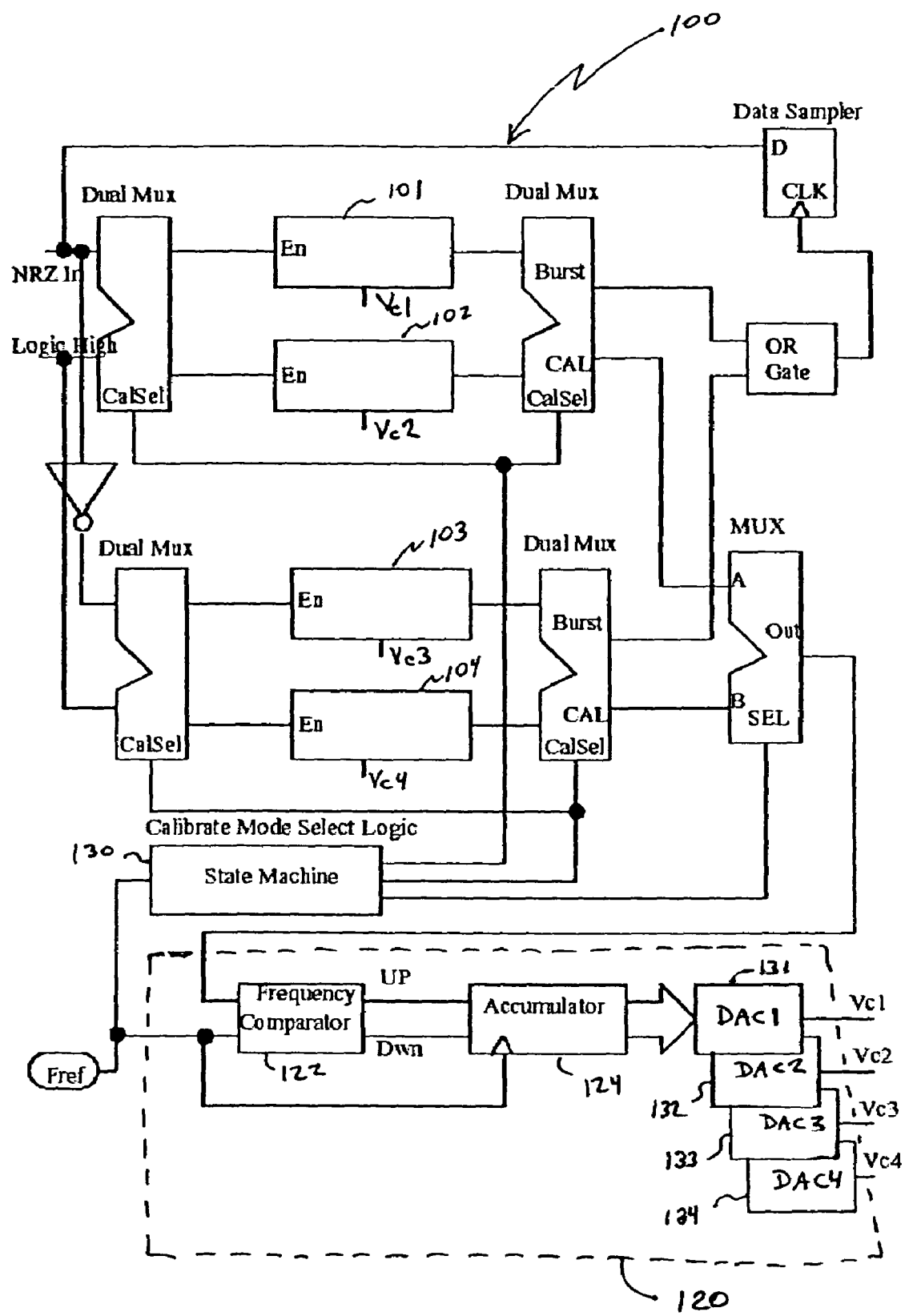
FIG. 1 shows a burst mode clock and data recovery (CDR) frequency calibrator including a frequency locked loop (FLL), in accordance with the principles of the present invention.
Figure 2:
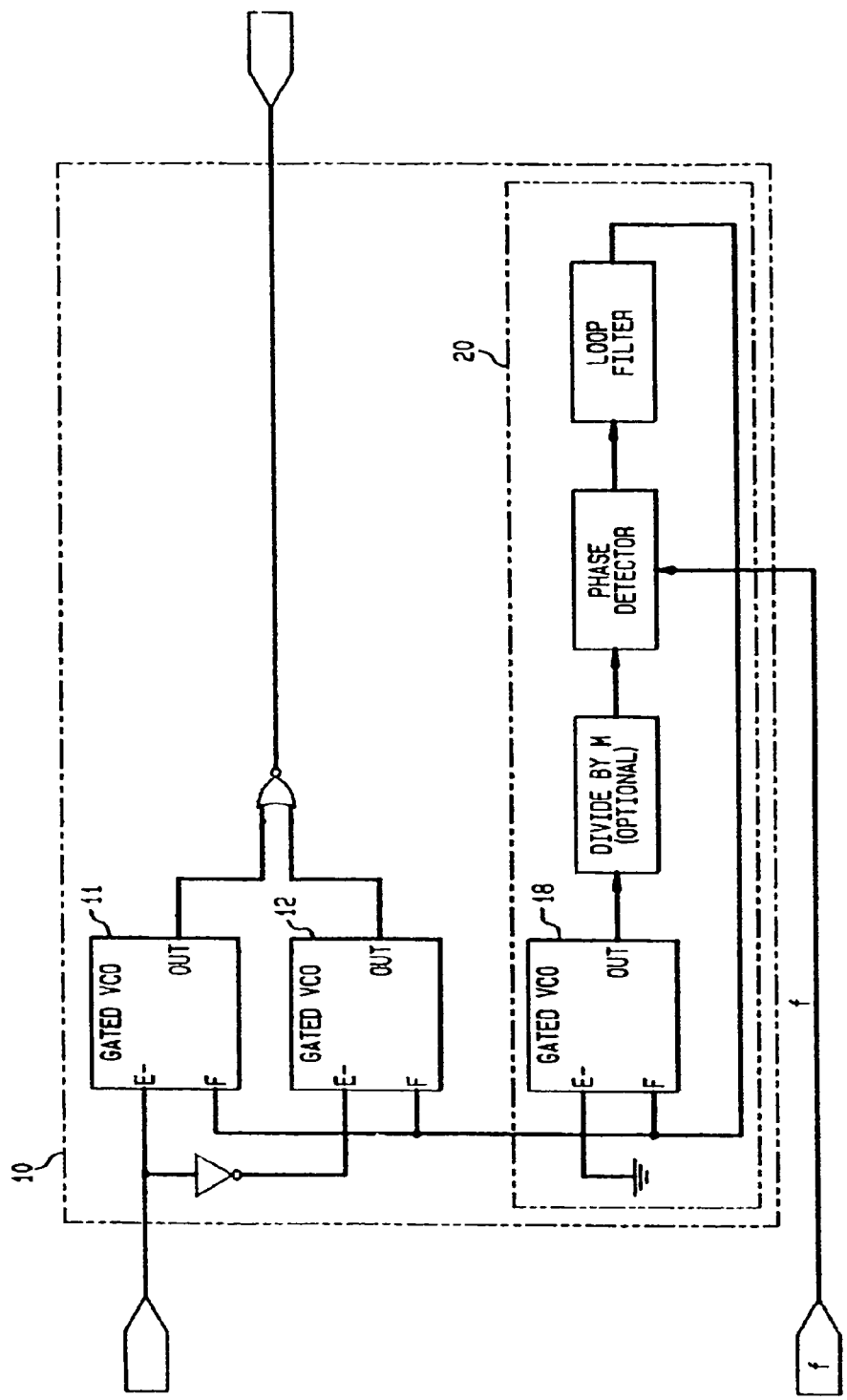
FIG. 2 shows a basic, conventional technique for burst mode data recovery pioneered by Alfred Dunlop, et al. at what is now LUCENT TECHNOLOGIES, as disclosed in U.S. Pat. No. 5,237,290.
Figure 3:
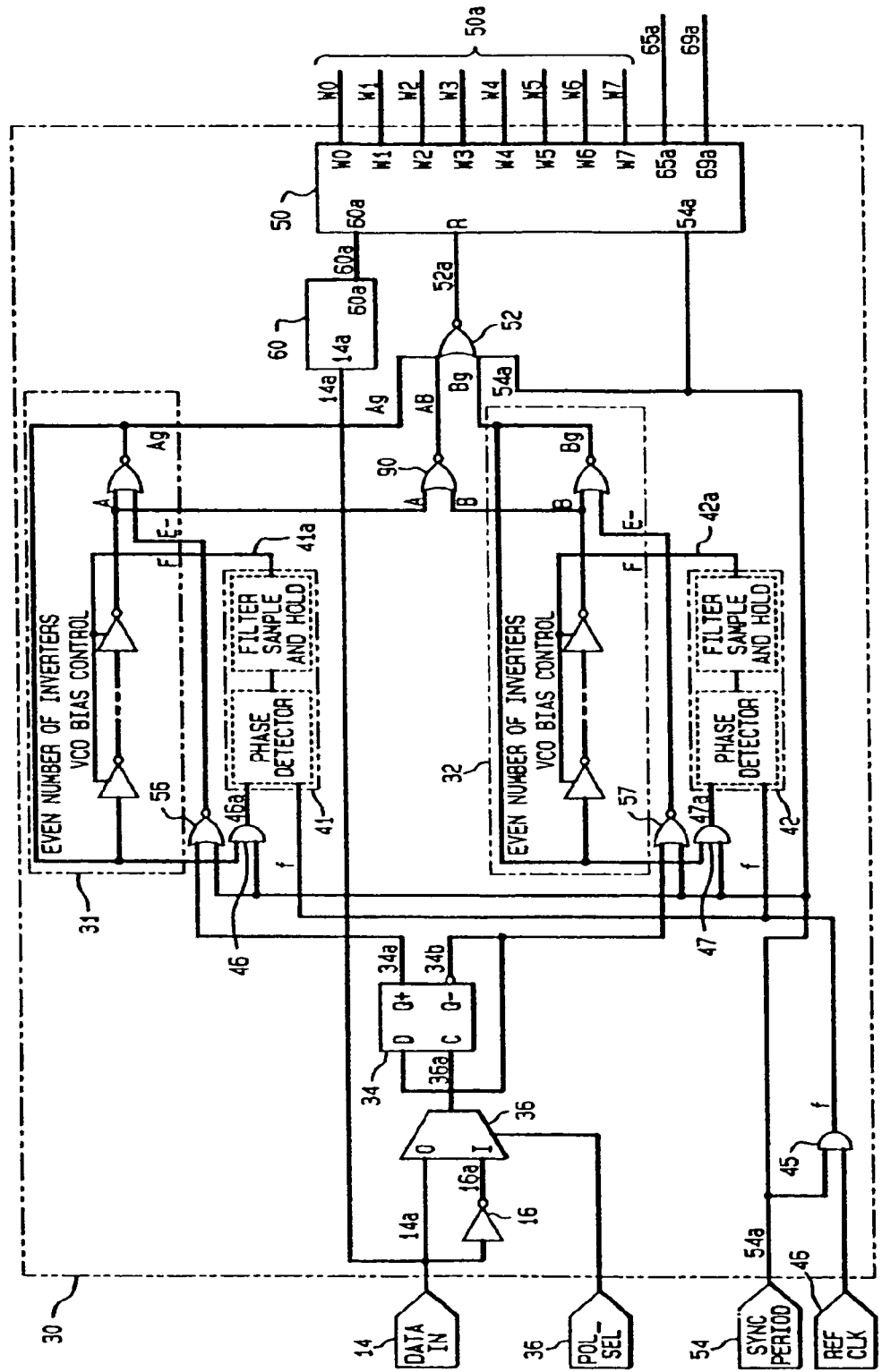
FIG. 3 shows a conventional technique to provide frequency calibration attempted by W. Pitio, et al. in 1992, as disclosed in U.S. Pat. No. 5,843,980.

In accordance with the principles of the present invention, a method of calibrating a voltage controlled oscillator comprises comparing a frequency of an output of a first voltage controlled oscillator to a reference frequency. A first digital value relating to a difference in frequency between the output of the first voltage controlled oscillator and the reference frequency is accumulated. A frequency of the output of the first voltage controlled oscillator is controlled based on the accumulated first digital value.

A method of calibrating a voltage controlled oscillator in a clock and data recovery (CDR) circuit in accordance with another aspect of the present invention comprises selecting a calibration mode for at least one voltage controlled oscillator in the CDR circuit, while another voltage controlled oscillator is in an operational mode. A frequency of an output of the at least one voltage controlled oscillator is compared to a reference frequency. A digital value relating to a difference in frequency between the output of the at least one voltage controlled oscillator and the reference frequency is accumulated. A frequency of the output of the at least one voltage controlled oscillator is controlled based on the accumulated digital value.

A clock and data recovery circuit in accordance with yet another aspect of the invention comprises a plurality of voltage controlled oscillators, each adapted for synchronization with a received data stream. A state machine selects a calibration mode for any of the plurality of voltage controlled oscillators. A frequency locked loop compares a frequency output from any of the plurality of voltage controlled oscillators to a reference frequency. An accumulator receives an output from the frequency locked loop, an output of which controls a frequency output from any one of the plurality of voltage controlled oscillators to within a desired tolerance of the reference frequency.

DETAILED DESCRIPTION OF ILLUSTRATIVE EMBODIMENTS

A direct calibration technique significantly tightens a tolerance band between multiple voltage controlled oscillators (VCOs), to correct for slight frequency mismatch between the multiple VCOs. The tightened tolerance band enhances the bit error rate (BER) and/or lengthens the possible consecutive identical digits (CIDs) length, and is particularly useful in integrated circuit applications.

In accordance with the principles of the present invention, a Frequency Locked Loop (FLL), an accumulator, and a DAC are implemented to form a calibration loop that becomes far more digital in nature than a PLL, permitting greater embedded circuit test coverage and ease of integration in VLSI digital technologies.

A frequency calibrated loop with digital accumulator and DAC in lieu of a PLL with associated charge pump integrator eliminates the need for large integrated capacitors, sensitivity to drift due to the leakage currents associated with deep sub-micron technologies, and embedded analog voltages which can not be tested.

FIG. 1 shows a burst mode clock and data recovery (CDR) frequency calibrator 100 including a frequency locked loop (FLL), in accordance with the principles of the present invention.

In particular, as shown in FIG. 1, four voltage controlled oscillators (VCOs) 101–104 are implemented. VCOs 101 and 102 are used to recover data in the input signal due to positive input transitions, while VCOs 103 and 104 are used to recover data in the input signal due to negative going transitions. One pair of VCOs is used at any one time. Thus, the unused remaining pair of VCOs may be inserted into the frequency locked loop calibrator circuit 120.

A suitable state machine 130 is clocked by a reference clock signal Fref. The switchover to calibration mode is handled by the state machine 130 in the disclosed invention. Those of ordinary skill in the art will appreciate that other mechanisms to initiate calibration mode may be implemented, including a digital signal processor (DSP).

A calibration loop formed by the frequency locked loop calibrator circuit 120 uses a frequency discriminator or frequency comparator 122 to determine if the frequency of the relevant VCO 101–104, or a divided quotient of the frequency output from the relevant VCO 101–104, is greater or less than the reference frequency Fref. Based on the result of the comparison performed by the frequency comparator 122, an integrator or digital accumulator 124 is updated with a new value, which is translated as necessary for the particular application into a suitable control variable used to directly alter the frequency of the relevant VCO 101–104 via a respective digital to analog converter (DAC) 131–134.

The calibration cycle may be permitted to exist as long as necessary for the particular application. Thus, since the calibration cycle may be active for a considerable amount of time, resolution of the frequency error between the VCOs 101–104 can be significantly reduced, e.g., down to a 100 parts-per-million (ppm) range or even less, allowing for very tight and direct control of the frequency of each of the VCOs 101–104, and thus greatly minimizing any frequency matching errors between all of the multiple VCOs 101–104 used for burst mode clock and data recovery.

Direct calibration of VCOs in accordance with the principles of the present invention accurately calibrates VCOs 101–104 each to a common reference frequency Fref. Thus, drift between the output frequencies of each VCOs will be very low, due primarily to temperature, mechanical stress and/or aging. Clock and data recovery (CDR) may be safely and reliably implemented even in the presence of very long non-return to zero (NRZ) data run lengths, without fear of generating phase errors due to a significant mismatch in frequencies output from various VCOs 101–104.

Without the use of direct calibration of multiple VCOs such as disclosed herein, individual VCOs might experience frequency output mismatch as measured in a control to frequency transfer function by as much as several percent. Such a significant error is seen by the present inventors as resulting in significant limits to allowable run length between data transitions, and/or to reduced tolerance to jitter in the data signal.

The disclosed frequency locked loop frequency calibrator is digital in nature, lending itself to easy implementation in a Built-In Self Test (BIST) feature. Thus, for instance, a control word in the FLL established to maintain a given frequency may be easily latched or scanned into a Built In Self Test (BIST) path. Moreover, a state machine to select the VCOs 101–104 can also be driven by a BIST test sequence, allowing each VCO 101–104 to be controllably exercised, thus accurately tested for proper manufacture and/or to establish an initial factory calibration level for each VCO 101–104.

While the present invention is shown and described with four VCOs 101–104, those of ordinary skill in the art will appreciate that a frequency locked loop frequency calibrator providing direct control of multiple VCOs may be implemented in circuits using fewer than four VCOs (e.g., only three or even only two VCOs), or in circuits using greater than four VCOs.

The present invention allows for the provision of greatly improved data communications integrated circuits (ICs) used in burst mode clock and data recovery (CDR) applications. Long consecutive identical digits (CIDS) in a non-return-to-zero (NRZ) burst mode CDR may be recovered with little or no penalty in an increase in bit error rate (BER).

A frequency locked loop frequency calibrator such as the embodiments disclosed support better the demands of more dense integrated circuit (IC) integration, through replacement of some analog elements that grow increasingly difficult to integrate in deep sub-micron processing, and by adding testability access and coverage.

While the invention has been described with reference to the exemplary embodiments thereof, those skilled in the art will be able to make various modifications to the described embodiments of the invention without departing from the true spirit and scope of the invention.

What is claimed is:

1. A method of calibrating a voltage controlled oscillator, comprising:
   comparing a frequency of an output of a first voltage controlled oscillator to a reference frequency;
   accumulating a first digital value relating to a difference in frequency between said output of said first voltage controlled oscillator and said reference frequency; and
   controlling a frequency of said output of said first voltage controlled oscillator based on said accumulated first digital value;
   comparing a frequency of an output of a second voltage controlled oscillator to said reference frequency;
   accumulating a second digital value relating to a difference in frequency between said output of said second voltage controlled oscillator and said reference frequency; and
   controlling a frequency of said output of said second voltage controlled oscillator based on said accumulated second digital value.

2. The method of calibrating a voltage controlled oscillator according to claim 1, further comprising:
   converting said accumulated first digital value into a first analog signal for control of said first voltage controlled oscillator.

3. A method of calibrating a voltage controlled oscillator, comprising:
comparing a frequency of an output of a first voltage controlled oscillator to a reference frequency;
accumulating a first digital value relating to a difference in frequency between said output of said first voltage controlled oscillator and said reference frequency;
controlling a frequency of said output of said first voltage controlled oscillator based on said accumulated first digital value; and
scanning said accumulated first digital value into a built-in self test (BIST) path.

4. The method of calibrating a voltage controlled oscillator according to claim 1, further comprising:
comparing a frequency of an output of a third voltage controlled oscillator to said reference frequency;
accumulating a third digital value relating to a difference in frequency between said output of said third voltage controlled oscillator and said reference frequency; and
controlling a frequency of said output of said third voltage controlled oscillator based on said accumulated third digital value.

5. The method of calibrating a voltage controlled oscillator according to claim 4, further comprising:
comparing a frequency of an output of a fourth voltage controlled oscillator to said reference frequency;
accumulating a fourth digital value relating to a difference in frequency between said output of said fourth voltage controlled oscillator and said reference frequency; and
controlling a frequency of said output of said fourth voltage controlled oscillator based on said accumulated fourth digital value.

6. The method of calibrating a voltage controlled oscillator according to claim 5, further comprising:
scanning each of said first digital value, said second digital value, said third digital value, and said fourth digital value into a built-in self test (BIST) path.

7. A method of calibrating a voltage controlled oscillator in a clock and data recovery (CDR) circuit, comprising:
selecting a calibration mode for at least one voltage controlled oscillator in said CDR circuit, while another voltage controlled oscillator is in an operational mode;
comparing a frequency of an output of said at least one voltage controlled oscillator to a reference frequency;
accumulating a digital value relating to a difference in frequency between said output of said at least one voltage controlled oscillator and said reference frequency; and
controlling a frequency of said output of said at least one voltage controlled oscillator based on said accumulated digital value.

8. The method of calibrating a voltage controlled oscillator in a clock and data recovery (CDR) circuit according to claim 7, further comprising:
converting said accumulated digital value into an analog signal for control of said at least one voltage controlled oscillator.

9. The method of calibrating a voltage controlled oscillator in a clock and data recovery (CDR) circuit according to claim 7, further comprising:
scanning said accumulated digital value into a built-in self test (BIST) path.

10. A clock and data recovery circuit, comprising:
a plurality of voltage controlled oscillators, each adapted for synchronization with a received data stream;
a state machine to select a calibration mode for any of said plurality of voltage controlled oscillators;
a frequency locked calibration loop to compare a frequency output from any of said plurality of voltage controlled oscillators to a reference frequency, said frequency locked calibration loop including an accumulator receiving an output from said frequency locked loop, an output of which controls a frequency output from any one of said plurality of voltage controlled oscillators to within a desired tolerance of said reference frequency.

11. The clock and data recovery circuit according to claim 10, further comprising:
a data sampler adapted to extract data from said received data stream.

12. The clock and data recovery circuit according to claim 10, wherein:
said accumulator is a digital accumulator.

13. The clock and data recovery circuit according to claim 12, further comprising:
a digital-to-analog converter (DAC) to convert an output of said digital accumulator into an analog frequency control signal for control of a given one of said plurality of voltage controlled oscillators.

14. The clock and data recovery circuit according to claim 12, further comprising:
a plurality of digital-to-analog converters (DACs) to convert an output of said digital accumulator into a respective analog frequency control signal for control of respective ones of said plurality of voltage controlled oscillators.

15. An integrated circuit including a clock and data recovery circuit, comprising:
a plurality of voltage controlled oscillators, each adapted for synchronization with a received data stream;
a state machine to select a calibration mode for any of said plurality of voltage controlled oscillators;
a frequency locked calibration loop to compare a frequency output from any of said plurality of voltage controlled oscillators to a reference frequency, said frequency locked calibration loop including an accumulator receiving an output from said frequency locked loop, an output of which controls a frequency output from any one of said plurality of voltage controlled oscillators to within a desired tolerance of said reference frequency.

16. The integrated circuit including a clock and data recovery circuit according to claim 15, further comprising:
a data sampler adapted to extract data from said received data stream.

17. The integrated circuit including a clock and data recovery circuit according to claim 15, wherein:
said accumulator is a digital accumulator.

18. The integrated circuit including a clock and data recovery circuit according to claim 17, further comprising:
a digital-to-analog converter (DAC) to convert an output of said digital accumulator into an analog frequency control signal for control of a given one of said plurality of voltage controlled oscillators.

19. The integrated circuit including a clock and data recovery circuit according to claim 17, further comprising:
a plurality of digital-to-analog converters (DACs) to convert an output of said digital accumulator into a respective analog frequency control signal for control of respective ones of said plurality of voltage controlled oscillators.

* * * * *